United States Patent [19]

Miyazaki et al.

[11] Patent Number: 5,048,800
[45] Date of Patent: Sep. 17, 1991

[54] VERTICAL HEAT TREATMENT APPARATUS

[75] Inventors: Shinji Miyazaki; Takahiko Moriya, both of Yokohama; Yasushi Yagi, Zama; Mituaki Komino, Tokyo; Katuhiko Iwabuchi, Sagamihara, all of Japan

[73] Assignees: Kabushiki Kaisha Toshiba, Kawasaki; Tokyo Electron Sagami Limited, Kanagawa, both of Japan

[21] Appl. No.: 563,345

[22] Filed: Aug. 7, 1990

[30] Foreign Application Priority Data

Dec. 27, 1988 [JP] Japan .............................. 63-329946
Aug. 7, 1989 [JP] Japan .............................. 1-204220

[51] Int. Cl.$^5$ ............................................. C21D 1/06
[52] U.S. Cl. ...................................... 266/256; 266/251
[58] Field of Search ................. 266/249, 251, 252, 256

[56] References Cited

U.S. PATENT DOCUMENTS 2,081,990  6/1937  Eberwein ........................... 266/256
4,445,852  5/1984  Corbett .............................. 266/256
4,846,675  7/1989  Soliman ............................ 266/256

Primary Examiner—S. Kastler
Attorney, Agent, or Firm—Oblon, Spivak, McClelland, Maier & Neustadt

[57] ABSTRACT

A vertical heat treatment apparatus includes a reaction furnace constituted by a reaction chamber having an inner tube and an outer tube and a heater arranged outside the reaction chamber, a manifold communicating with a lower portion of the reaction chamber to support the reaction chamber and a gas being supplied and exhausted through the mainfold, a hollow vessel, arranged together with the boat in the reaction furnace, for supporting a lower end of a boat having objects, and a plurality of first heat-insulating members detachably arranged in the hollow vessel, wherein the number of the first insulating members is adjusted to adjust a heat-insulating effect. The first heat-insulating member includes a fin unit constituted by fins horizontally arranged at predetermined intervals and spacers for keeping the intervals between the fins.

6 Claims, 4 Drawing Sheets

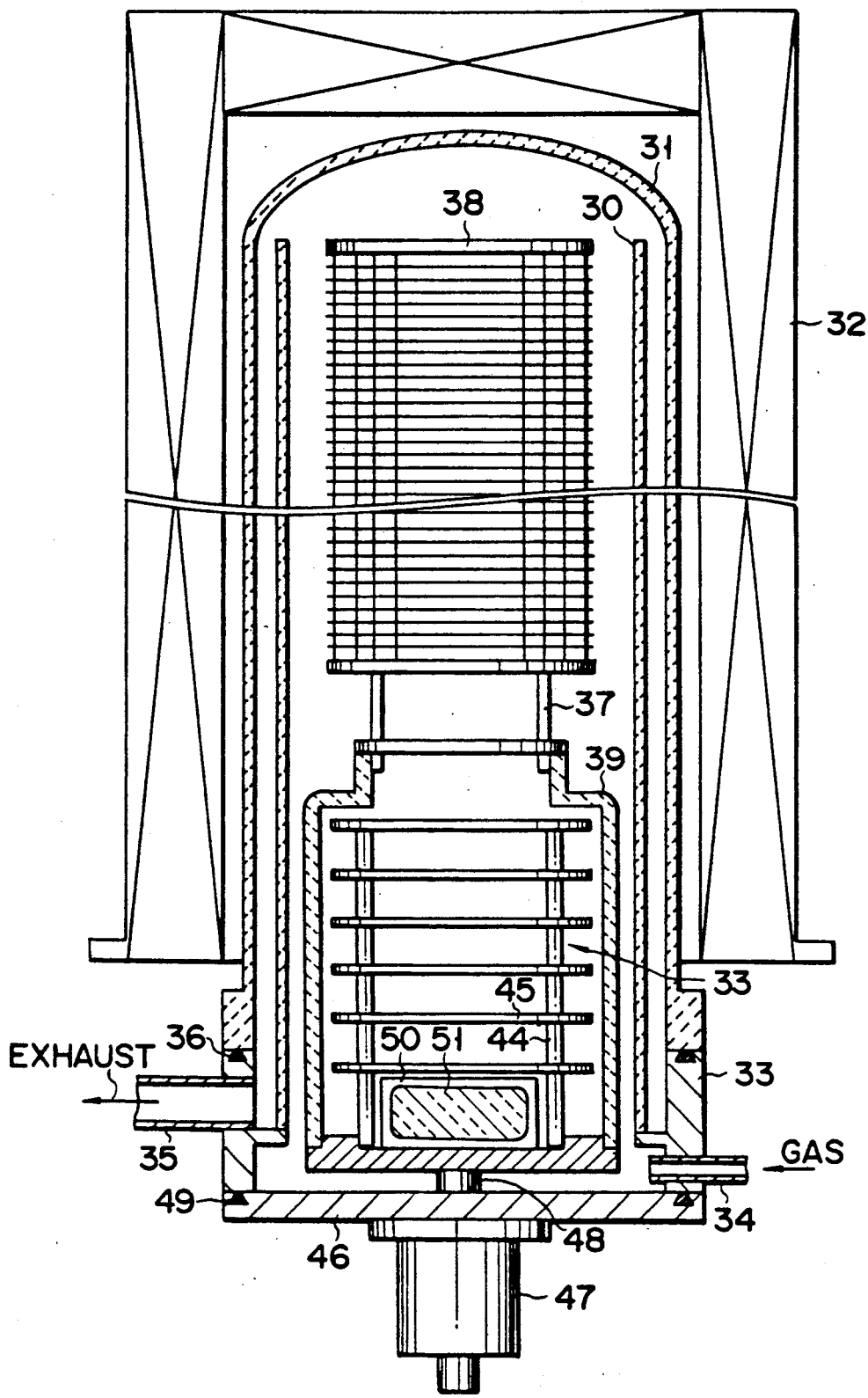
F I G. 3

VERTICAL HEAT TREATMENT APPARATUS

Background of the Invention

1. Field of the Invention

The present invention relates to a vertical heat treatment apparatus.

2. Description of the Related Art

A batch type vertical heat treatment apparatus is used in a thermal diffusion process or a film forming process in the process for manufacturing a semiconductor device. According to the vertical heat treatment apparatus, the space and energy can be saved, and automatic operation can be realized. A semiconductor wafer having a large diameter can be easily treated.

A conventional vertical heat treatment apparatus has, e.g., a structure shown in FIG. 1. A heater 12 is arranged around a double tube constituted by an outer tube 11 and an inner tube 10 stored in the outer tube 11, thereby forming a reaction furnace. The reaction furnace is almost vertically arranged. A wafer boat 14 in which a large number of semiconductor wafers are superposed at predetermined intervals is vertically arranged in the inner tube inside the reaction furnace. The wafer boat 14 is mounted on a hollow heat-insulating cylinder 15 inserted under the reaction furnace, and the wafer boat 14 can be vertically moved together with the heat-insulating cylinder 15 by a conveying means. A hollow portion 16 of the insulating cylinder is filed with, e.g., quartz wool or the like, or evacuated, thereby enhancing a heat-insulating effect.

A manifold 17 is connected to the lower portion of the reaction furnace to support the inner tube 10 and the outer tube 11. A gas supply tube 18 and a gas exhaust tube 19 are connected to the manifold 17.

The heat-insulating cylinder 15 is supported by a table 20. A magnetic seal shaft 21 is connected to the center of the bottom of the table 20. The magnetic seal shaft 21 is connected to a magnetic fluid seal unit 23 fixed on a flange 22 for hermetically sealing the opening of the minifold 17. The general magnetic fluid seal unit 23 comprises the magnetic seal shaft 21 made of a magnetic material, a rotating member constituted by a cylindrical permanent magnet spaced apart from the magnetic seal shaft 21 by a predetermined interval and a magnetic fluid sealed in the interval. The magnetic fluid is made by dispersing magnetic particles such as iron particles in a base oil such as a fluorine-based oil. The magnetic fluid transmits rotation between the magnetic seal shaft 21 and the rotating member by an operation of a magnetic flux circuit between the magnetic seal shaft 21 and the rotating member while airtightness of the magnetic fluid seal unit is held.

O-rings 24 and 25 serving as seal members are arranged at a position where the manifold 17 is brought into contact the outer tube 11 or the flange 22.

In a vertical heat treatment apparatus with the above arrangement, formation of an SiN film on the wafer 13 will be described below. $NH_3$ and $SiH_2Cl_2$ gases as treatment gasses are supplied from the individual gas supply tube 18. At this time, the interior of the reaction furnace is heated by the heater 12 to a temperature of 600° to 900° C. which is a treatment temperature. An SiN film is formed on the wafer 13 in a uniform temperature region of the reaction furnace held at the temperature. However, in a region held at a low temperature of 100° to 150° C. in the reaction furnace, the SiN film is not formed on the wafer 13. In place of this, $NH_4Cl$ is produced as a reaction by-product in the low temperature region. Since a region near the manifold 17 is separated from the heater 12 and easily cooled, this $NH_4Cl$ is conspicuously produced.

That is, in the apparatus shown in FIG. 1, the heat of the heater 12 is not transmitted near the manifold 17 due to the presence of the heat-insulating cylinder 15 having a heat-insulating effect. Therefore, a temperature near the manifold 17 is easily to be a temperature of 100° C. or less. As a result, this $NH_4Cl$ is easily produced on the inner surfaces of the manifold 17 and the flange 22. This $NH_4Cl$ in the form of particles causes formation of foreign particles. In particular, when micropatterning is performed in a 4MDRAM or the like, the foreign particles each having a diameter of 0.1 $\mu m$ largely affect a yield of an IC.

When the heat-insulating effect is excessively suppressed to avoid the above problem, heat convection occurs near the heat-insulating cylinder 15. Therefore, a change in heat in the constant temperature region of the reaction furnace is increased, and films can be uniformly formed on each wafer 13. In addition, since a temperature near the manifold 17 and the flange 22 is increased, the O-rings 24 and 25 arranged in these portions are degraded within a short period. When the wafer boat 14 is rotated, radiation heat passing through the hole of the central shaft of the heat-insulating cylinder 15 reaches the magnetic fluid seal unit 23 arranged in the lower portion of the heat insulating cylinder 15, thereby increasing the temperature of the magnetic fluid seal unit 23. For this reason, a base oil in the magnetic fluid is evaporated, thereby degrading airtightness of the reaction furnace.

In order to suppress production of the foreign particles, the conventional heat-insulating cylinder 15 must be designed by experiences or a trial-and-error. For this reason, a heat-insulating member is very difficult to design such that desired heat-insulating effect can be obtained in the reaction furnace.

In addition, since different treatment temperatures are required for a high-temperature treatment at about 1,000° C. and a low-temperature treatment at about 600° C., in either treatment, foreign particles must be minimized near the manifold 17. For this reason, heat-insulating structures corresponding to the treatments are required to be designed.

SUMMARY OF THE INVENTION

It is an object of the present invention to provide a vertical heat treatment apparatus capable of easily designing of a heat-insulating structure for obtaining a desired heat-insulating effect and heat-treating an object while a proper heat-insulating operation corresponding to treatments having different treatment temperatures.

This object is achieved by a vertical heat treatment apparatus comprising a reaction furnace constituted by a reaction chamber having an inner tube and an outer tube and a heater arranged outside the reaction chamber, a manifold means communicating with a lower portion of the reaction chamber to support the reaction chamber and a gas being supplied and exhausted through the mainfold means, a hollow vessel for supporting a lower end of a boat having objects and arranged together with the boat in the reaction furnace, and a plurality of first heat-insulating members detachably arranged in the hollow vessel, wherein the number of first insulating members is adjusted to adjust a heat-insulating effect.

A vertical heat treatment apparatus of the present invention enhances an effect, when the first heat-insulating member comprises a fin unit constituted by fins horizontally arranged at predetermined intervals and spacers for keeping the intervals between the fins.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view for explaining a vertical heat treatment apparatus according to another embodiment of the present invention.

DETAILED DESCRIPTION OF THE PREFERRED EMBODIMENTS

An embodiment of the present invention will be described below with reference to the accompanying drawings.

Figure 1:
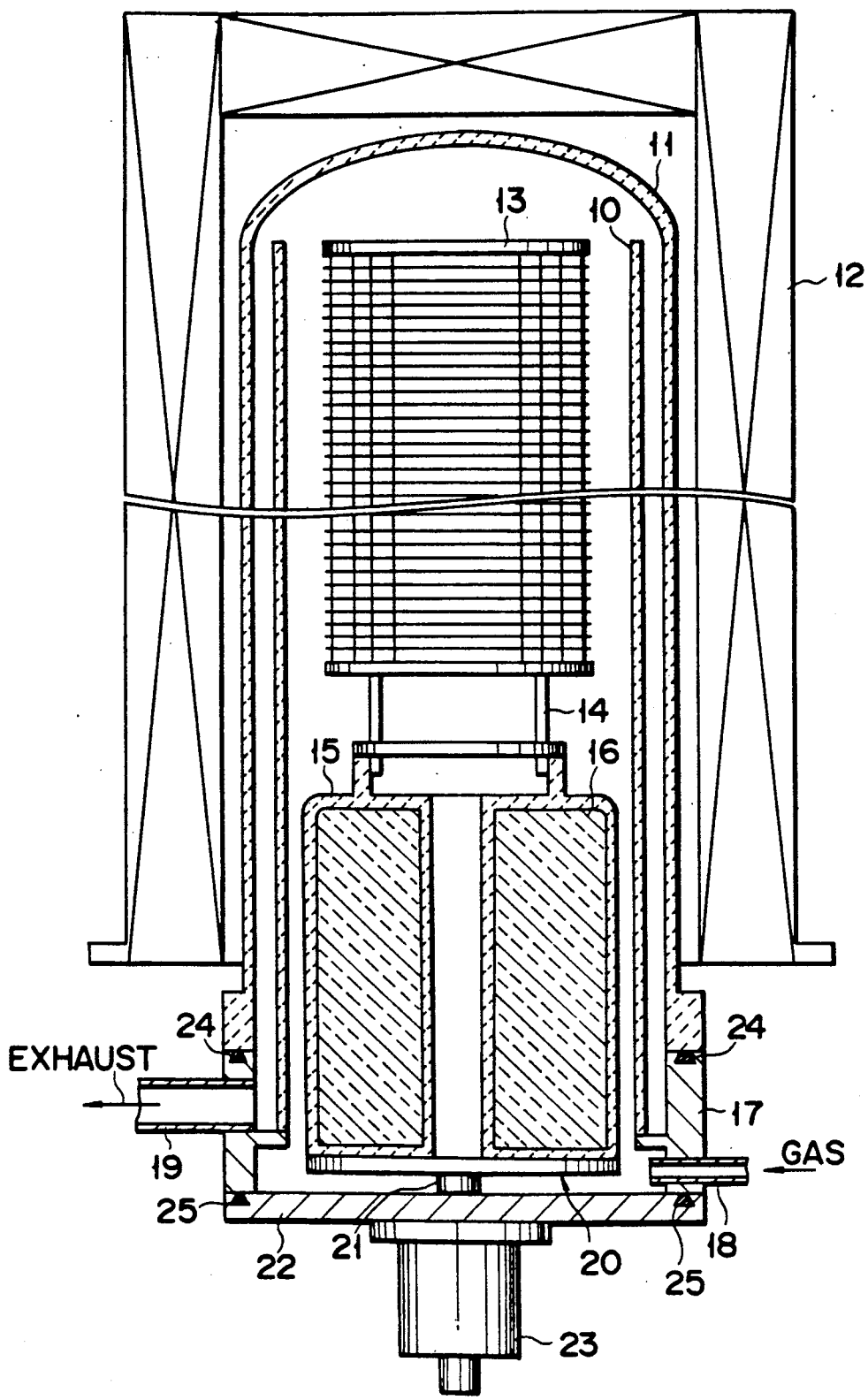
FIG. 1 is a view for explaining a conventional vertical heat treatment apparatus.
Figure 2:
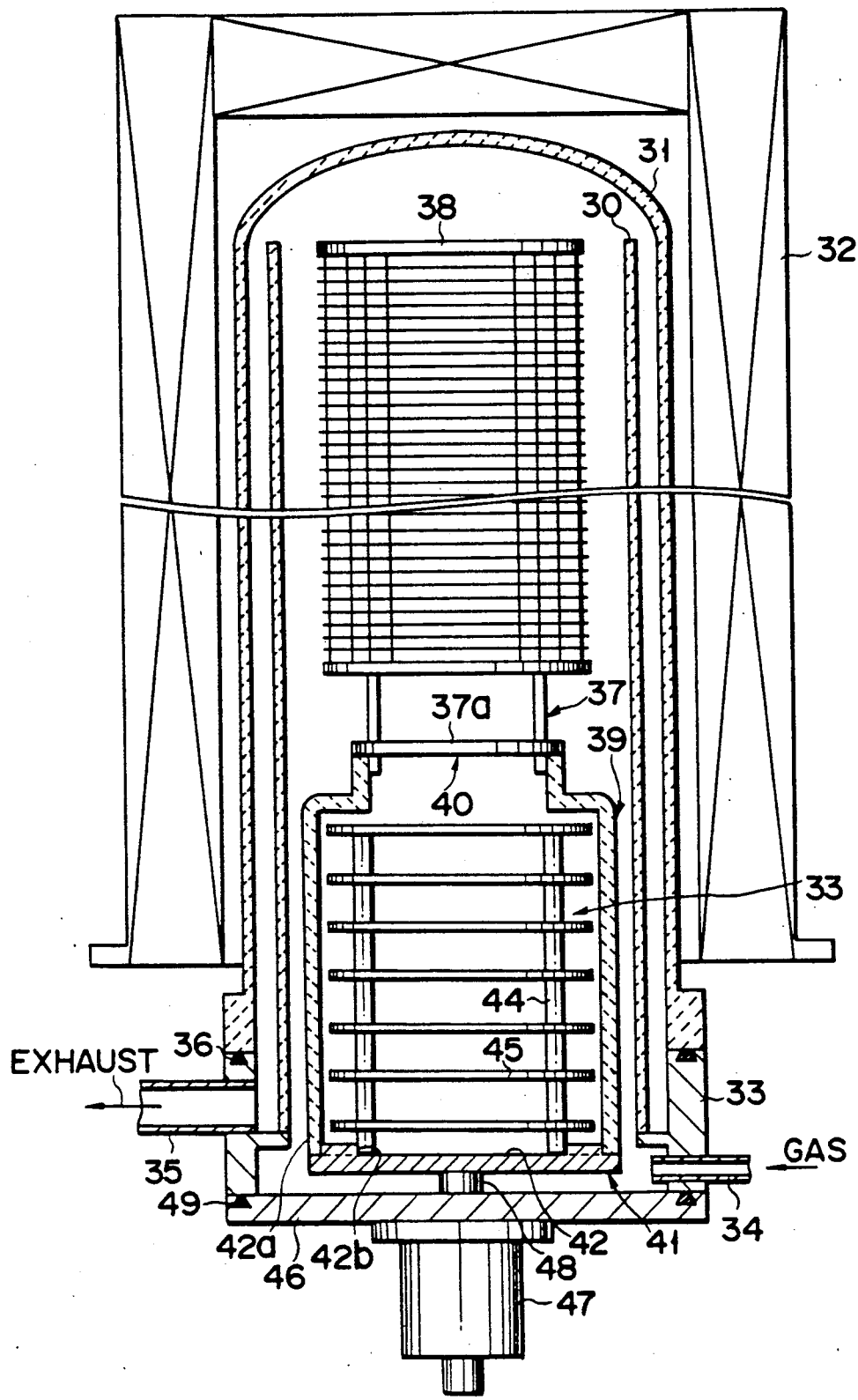
FIG. 2 is a view for explaining a vertical heat treatment apparatus according to an embodiment of the present invention.

FIG. 2 is a schematic view for explaining a vertical heat-insulating apparatus of the present invention. Referring to FIG. 2, reference numeral 30 denotes a cylindrical inner tube. A cylindrical outer tube 31 is arranged outside the inner tube 30 to surround the inner tube 30. The inner and outer tubes 30 and 31 are made of quartz to constitute a reaction chamber. A heater 32 is arranged outside the outer tube 31 to surround the outer tube 31. A reaction furnace is constituted by the inner and outer tubes 30 and 31 and the heater 32. A manifold 33 connected to the inner and outer tubes 30 and 31 to support the inner and.outer tubes 30 and 31 is arranged at the lower portion of the reaction chamber. A gas supply tube 34 communicating with the inner tube 30 and an exhaust tube 35 communicating with the outer tube 31 are connected to the manifold 33. The lower surface of the outer tube 31 and the upper surface of the manifold 33 are brought into contact and sealed with each other through an O-ring 36.

A hollow vessel 39 for supporting the lower end portion of a wafer boat 37 is arranged in the reaction furnace. A plurality of wafers 38 are horizontally supported on the wafer boat 37 at predetermined intervals. The hollow vessel 39 has an upper opening 40 and a lower opening 41, and the upper opening 40 is closed by a lower end portion 37a. The lower opening 41 is closed by a table 42. The lower end of the hollow vessel 39 is positioned to be fitted in a first step 42a formed in the table 42. As a material for the hollow vessel 39, quartz or SiC which is hard to not produce an impurity is preferably used. When quartz is used, an opaque quartz or a quartz having a sand-blasted surface for preventing heat radiation is preferably used. Note that the shape of the sectional surface of the hollow vessel is preferably circular to improve a heat-insulating effect.

A fin structure 43 having a heat-insulating member and mounted on the table 42 is arranged in the hollow vessel 39. The fin structure 43 is constituted by stacking a plurality of fin units comprising, spacer shafts 44 e.g., four and a fin 45 positioned and supported on the upper end of the spacer 44. In the fin structure 43, since the fin unit can be easily detached, a heat-insulating effect can be freely adjusted in accordance with a heat treatment temperature by changing the number of fin units.

Figure 4:
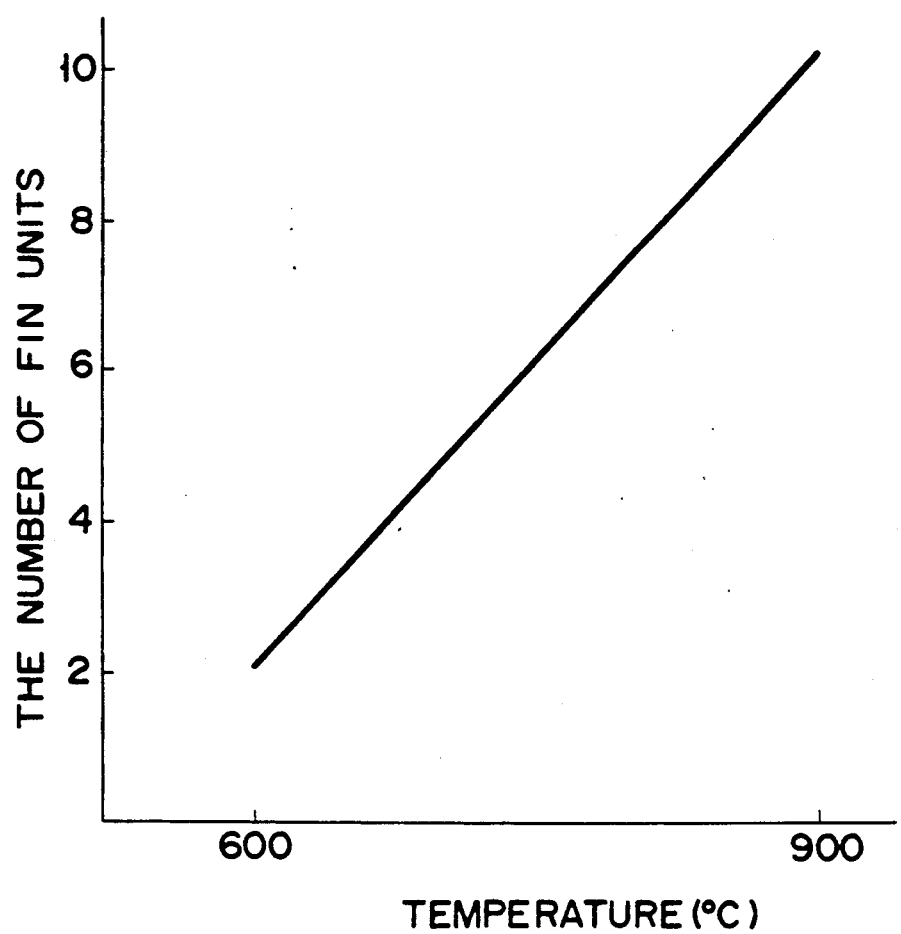
FIG. 4 is a graph showing a relationship between a treatment temperature and the number of fin units in a fin structure.

FIG. 4 is a graph showing a relationship between a treatment temperature and the number of fin units in the fin structure for providing a heat-insulating effect suitable for the treatment temperature in the case of the formation of a BPSG (born phosphorous silicate glass) film on the wafer. The graph is applicable to the case of the formation of an SiN film, a PSG (phosphorous silicate glass) film, or an AsSG (arsenic silicate glass) film. The number of fin units in the fin structure is determined in accordance with the relationship shown in FIG. 4, thereby excellently performing the heat treatment. Note that, as a material for the fin structure 43, a material which prevents from producing foreign particles and prevents heat radiation is preferably used. As this material, quartz, SiC, quartz-SiC, graphite-SiC or the like is used. When quartz is used, an opaque quartz or a quartz having a sand-blasted surface for preventing heat radiation is preferably used. The disk-like fin 45 is preferably used to effectively prevent heat radiation. In addition, the four lowermost spacer shafts 44 are positioned to be fitted in the second step 42b of the table.

As a heat-insulating member, a member which is easily detachable and the heat-insulating effect of which can be adjusted may be used. As the heat-insulating member, in addition to the fin unit, for example, a hollow member having an evacuated hollow portion, a hollow member filled with a heat insulator, or the like is used. A plurality of heat-insulating members are provided, and the number thereof is variable to adjust a heat-insulating effect.

The table 42 is supported by a magnetic seal shaft 48 of a magnetic fluid seal unit 47 arranged in a flange 46. The flange 46 is brought into contact with the lower surface of the manifold 33 through an O-ring 49 to hermetically seal the reaction furnace. A magnetic fluid is stored inside the magnetic fluid seal unit 47, and the magnetic fluid seal unit 47 formed to rotate the hollow vessel which supports the wafer boat 37. The treatment is performed while the wafer boat 37 is rotated, and the surface of the wafer 38 is uniformly treated. For example, when a thin film is formed, uniformity of the thickness of the entire film can be improved.

The wafer boat 37, the hollow vessel 39, the table 42, the flange 46, and the magnetic fluid seal unit 47 are integrally moved by a conveying means (not shown) which can be vertically moved. Therefore, the wafer 38 supported by the wafer boat 37 can be arranged in a uniform temperature region in the reaction furnace.

An operation for performing a heat treatment using a vertical heat treatment apparatus with the above arrangement will be described below.

Since the hollow vessel 39 is supported on the table 42, the hollow vessel 39 is separated from the table 42, and the fin structure 43 in the hollow vessel 39 can be easily removed. Thus, the fin structure 43 is removed from the hollow vessel 39, and before the treatment, the number of fin units in the fin structure 43 is set to obtain a heat-insulating effect corresponding to a treatment temperature in accordance with the graph shown in FIG. 4.

Thereafter, the fin structure 43 is arranged in the hollow vessel 39. The wafer boat 37 is mounted on the upper end opening 40 of the hollow vessel 39. The wafer boat 37, the hollow vessel 39, the table 42, the flange 46, and the magnetic fluid seal unit 47 are raised together by a conveying means (not shown). When the flange 46 is brought into contact with the lower end surface of the manifold 33, the operation of the conveying means is stopped. As a result, the wafer 38 of the wafer boat 37 is arranged in a uniform temperature region of the inner tube 30.

Thereafter, the interior of the inner tube 30 is purged with, e.g., $N_2$ gas and heated to a treatment temperature by the heater 32. After the temperature of the interior of the inner tube 30 is stabilized, a process gas such as $NH_3$ gas or $SiH_2Cl_2$ gas is supplied from the gas supply tube 34 into the inner tube 30. The gas is supplied, and the gas is immediately exhausted from the gas exhaust tube 35 to start formation of an SiN film on the wafer mounted on the wafer boat 37. Note that, in this case, the magnetic seal shaft 48 is rotated by a motor (not shown), thereby integrally rotating the table 42, the hollow vessel 39, and the wafer boat 37 together.

The fin 45 interrupts radiation heat from the uniform temperature region in the inner tube 30. In this case, the fin 45 is made of opaque quartz, or the surface of the fin 45 is sand-blasted, thereby effectively decreasing the transmittance of radiation heat.

In the fin structure, since the heat-insulating effect corresponding to the treatment temperature is set in advance, a temperature is held at, e.g., a temperature of 140° to 150° C near the manifold 33. A temperature at which $NH_4Cl$ is produced usually falls within the range of 80° to 100° C., thereby preventing production of $NH_4Cl$ near the manifold 33.

A thermal change in the uniform temperature region of the inner tube 30 can be reduced by this heat-insulating effect.

When a temperature near the manifold 33 is suppressed to 140° to 150° C., the temperature of the magnetic fluid seal unit 47 is about 50° C. For this reason, evaporation of a base oil in a magnetic fluid stored in the magnetic fluid seal unit 47 can be prevented, and the reaction furnace is always sealed.

In addition, since the upper end opening 40 of the hollow vessel 39 and the lower end opening 41 of the hollow vessel 39 are closed by the wafer boat 37 and the table 42, respectively, the process gas does not flow into the hollow vessel 39. However, since the upper end opening 40 and the lower end opening 41 are not hermetically sealed, a very small amount of gas inevitably flows into the hollow vessel 39 through the upper and lower end openings 40 and 41. Therefore, a reaction product may be attached to a low-temperature part of the fin structure 43. However, since the flow rate of the process gas flowing into the hollow vessel 39 is very small, swirling does not occur in the hollow vessel 39. Therefore, the reaction product attached to the fin 45 is not peeled. Even if the reaction product attached to the fin 45 is peeled, the reaction product can be surely prevented by the hollow vessel from attaching to the wafer 38 as particles.

In addition, since a temperature near the manifold 33 can be set at the above temperature, thermal degradation of the O-rings 36 and 49 serving as seal members of the manifold 33 can also be prevented. Production of a metal impurity can be prevented in the manifold 33, thereby preventing an adverse influence on the wafer 38 due to the impurity.

In this embodiment, a case wherein an SiN film is formed on a wafer. However, when a PSG film, a BPSG film, or an AsSG film is formed, the same effect as described above can be obtained.

Thus, a yield of the semiconductor device can be improved by performing a treatment using the vertical heat treatment apparatus of the present invention.

The present invention is not limited to the above embodiment, and various modifications may effected within the spirit and scope of the present invention.

FIG. 3 is a view showing another embodiment of a vertical heat treatment apparatus according to the present invention. In this embodiment, a hollow member 50 having a high heat-insulating effect is arranged in a hollow vessel 39 in addition to a fin structure 43. The hollow member 50 is made of, e.g., quartz. An interior 51 of the hollow member is evacuated or filled with an insulator such as quartz wool. Since heat convection in the interior 51 can surely be prevented, the hollow member 50 is suitable for an adjusting member of a heat-insulating effect. Especially, in a vertical heat treatment apparatus, since various treatments are performed, a desired number of hollow members 50 having a high heat-insulating effect can be arranged in accordance with treatment temperatures to adjust the heat-insulating effect. For example, when a treatment temperature is about 1,000° C., a temperature near a manifold 33 and the flange 46 can be set to be a desired temperature by providing the hollow member 50 having a high heat-insulating effect. In addition, when a magnetic fluid stored in a magnetic fluid seal unit 47 is heated to 50° C., its service life is suddenly shortened. For this reason, the hollow member 50 is mounted on a table 42 to prevent to increase the temperature of the magnetic fluid seal unit 47. Note that, in order to further improve the heat-insulating effect, a plurality of hollow members 50 may be arranged.

The vertical heat treatment apparatus of the present invention can be applied to not only formation of an SiN thin film, but formation of various thin films such as an $SiO_2$ or polysilicon film, and other heat treatments except for formation of a thin film. In this case, production of foreign particles can be prevented, and a yield can be improved.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A vertical heat treatment apparatus, comprising:
    a reaction furnace constituted by a reaction chamber having an inner tube and an outer tube and a heater arranged outside said reaction chamber;

a manifold means communicating with a lower portion of said reaction chamber to support said reaction chamber, a gas being supplied an exhausted through said manifold means;

a wafer boat having a plurality of wafers mounted thereon and arranged in a uniform temperature region in said reaction furnace;

a hollow vessel for leading a gas to said uniform temperature region and for supporting a lower end of said wafer boat; and a plurality of first heat-insulating members made of a material selected from the group consisting of quartz, SiC, quartz-SiC and graphite-SiC, and arranged in said hollow vessel;

wherein said hollow vessel prevents a gas from being in contact with said first insulating members.

2. An apparatus according to claim 1, wherein said first heat-insulating member comprises a fin unit constituted by fins horizontally arranged at predetermined intervals and spacers for keeping the intervals between said fins.

3. An apparatus according to claim 2, wherein a surface of said fin is made of a material selected from the group consisting of opaque quartz, a quartz having a sandblasted surface, and a material which is treated to prevent heat radiation.

4. An apparatus according to claim 2, wherein said hollow vessel comprises at east one second insulating ember which is detachable.

5. An apparatus according to claim 4, wherein said second heat-insulating member is a hollow member evacuated or filled with a heat insulator.

6. An apparatus according to claim 1, wherein said first heat-insulating members are detachably arranged within the region defined by said hollow vessel, and the number of said first heat-insulating members is selected in view of a treatment temperature.

* * * * *

UNITED STATES PATENT AND TRADEMARK OFFICE
CERTIFICATE OF CORRECTION

PATENT NO. : 5,048,800
DATED : September 17, 1991
INVENTOR(S) : Shinji Miyazaki et al.

It is certified that error appears in the above-identified patent and that said Letters Patent is hereby corrected as shown below:

Title page, item (30):
  The First Foreign Application Priority Data should be deleted.

Signed and Sealed this

Thirteenth Day of April, 1993

Attest:

STEPHEN G. KUNIN

*Attesting Officer*       Acting Commissioner of Patents and Trademarks